(12) United States Patent
Chan et al.

(10) Patent No.: US 6,813,298 B2
(45) Date of Patent: Nov. 2, 2004

(54) CURRENT BLOCKING STRUCTURE TO IMPROVE SEMICONDUCTOR LASER PERFORMANCE

(75) Inventors: Yuen Chuen Chan, Singapore (SG); Teik Kooi Ong, Singapore (SG); Yee Loy Lam, Singapore (SG)

(73) Assignee: Denselight Semiconductor PTE Ltd., Singapore (SG)

( * ) Notice: Subject to any disclaimer, the term of this patent is extended or adjusted under 35 U.S.C. 154(b) by 0 days.

(21) Appl. No.: 10/288,707

(22) Filed: Nov. 6, 2002

(65) Prior Publication Data

US 2003/0086462 A1 May 8, 2003

(30) Foreign Application Priority Data

Nov. 6, 2001 (GB) .............................................. 0126642

(51) Int. Cl.[7] ................................................. H01S 3/19
(52) U.S. Cl. .............................. 372/45; 372/46; 372/47; 372/49; 372/43
(58) Field of Search .............................. 372/45, 46, 48, 372/49, 47; 357/16, 17

(56) References Cited

U.S. PATENT DOCUMENTS

| | | | | |
|---|---|---|---|---|
| 4,597,085 A | * | 6/1986 | Mito et al. ..................... | 372/45 |
| 5,148,439 A | | 9/1992 | Wiinstel et al. | |
| 5,400,355 A | * | 3/1995 | Ishida .......................... | 372/46 |
| 5,472,907 A | * | 12/1995 | Binsma et al. ................ | 438/31 |
| 5,692,002 A | | 11/1997 | Mizutani | |
| 5,796,768 A | * | 8/1998 | Mersali et al. ................ | 372/45 |
| 6,222,865 B1 | * | 4/2001 | Stoltz et al. .................. | 372/46 |
| 6,229,836 B1 | * | 5/2001 | Okuda ......................... | 372/48 |

FOREIGN PATENT DOCUMENTS

| | | |
|---|---|---|
| EP | 0 314 372 A2 | 5/1989 |
| EP | 0 814 549 A2 | 12/1997 |
| JP | 03 276688 A | 12/1991 |
| WO | WO 96/19023 | 6/1996 |

OTHER PUBLICATIONS

PCT Notification of Transmittal of the International Search Report on the Declaration, dated Dec. 19, 2003 for PCT/GB02/04994, 7pgs.

(List continued on next page.)

*Primary Examiner*—Don Wong
*Assistant Examiner*—Dung T Nguyen
(74) *Attorney, Agent, or Firm*—Buckley, Maschoff & Talwalkar LLC

(57) ABSTRACT

The layer structure of a DC-PBH laser diode consists of an n-InP substrate (51), an n-InP buffer layer (52), an undoped-InGaAsP active layer (53), a p-Inp cladding layer (54), a p-InP current blocking layer (55), an n-InP current blocking layer (56), a p-InP cladding layer (57), and a p-InGaAsP contact layer (58). An additional layer of Fe-doped InP layer (55a) creates an acceptor level ($Fe^{3+}/Fe^{2+}$) near mid-band gap. The iron impurities are deep level traps, and will make the capacitance $C_2$ less dependent of the impurity concentration of layer (56) which is normally doped with a concentration larger than $1 \times 10^{18}$ $cm^{-3}$ to lower the leakage current from p-InP blocking layer (57) to p-InP blocking layer (55) that does not contribute to light emission. The capacitance $C_2$ and hence the overall capacitance $C_{p-n-p-n}$ will be reduced with this Fe doped InP layer (55a) and consequently the displacement current through the current blocking structure during high speed operation will be lowered. In addition, as this Fe-doped InP layer is also a thermally stable semi-insulating material, a high resistivity layer is thus formed between the n-InP blocking layer (56) and P-InP blocking layer (55). Thus, this Fe doped InP layer (55a) will also effectively reduce the leakage current flowing through the p-n-p-n current blocking channel as mentioned above.

31 Claims, 3 Drawing Sheets

OTHER PUBLICATIONS

T. Numai, M. Fujiwara, N. Shimosaka, K. Kaedo, M. Nishio, S. Suzuki, and I. Mito, "1.5 µm */4–shifted DFB LD filter and 100 Mbit/s two–channel wavelength signal switching", Electronics Letters, vol. 24, No. 4, Feb. 18, 1998, pp. 236–237.

W. T. Tsang, R. A. Logan, and J. P. van der Ziel, "A new lateral selective–area growth by liquid–phase epitaxy: The formation of a lateral double–barrier buried–heterostructure laser", Appl. Phys. Letters, vol. 40, No. 11, Jun. 1, 1982, © American Institute of Physics, pp. 942–944.

* cited by examiner

CURRENT BLOCKING STRUCTURE TO IMPROVE SEMICONDUCTOR LASER PERFORMANCE

"This application is a U.S. National filing under 35 U.S.C. §119 hereby claiming priority to GB Application No. 0126642.8, filed Nov. 6, 2001, the contents of which are incorporated herein by reference for all purposes."

BACKGROUND TO THE INVENTION

Buried heterostructure semiconductor lasers have the advantages of operating at low lasing threshold current, high temperature, and providing stable fundamental lateral mode lasing at high optical output. A prior art double-channel planar buried-heterostructure (DC-PBH) laser diode utilizing the p-n-p-n current confinement structure has been demonstrated with GaAs to enhance the current confinement to the active layer [W. T. Tsang, R. A. Logan, and J. P. van der ziel, "A new lateral selective-area growth by liquid-phase epitaxy; The formation of a lateral double-barrier buried-heterostructure laser", Appl. Phys. Lett., vol. 40, pp. 942–944, 1982.]. FIG. 1 shows the layer structure of a similarly configured DC-PBH laser diode based on InP [T. Numai, M. Fujiwara, N. Shimosaka, K. Kaede, M. Nishio, S. Suzuki, and I. Mito, "1.5 µm λ/4-shifted DFB LD filter and 100 Mbit/s two-channel wavelength signal switching", Electron. Lett., vol. 24, pp. 236–237, 1988.]. It consists of an n-InP substrate 11, an n-InP buffer layer 12, an undoped-InGaAsP active layer 13, a p-InP cladding layer 14, a p-InP current blocking layer 15, an n-InP current blocking layer 16, a p-InP cladding layer 17, and a p-InGaAsP contact layer 18. Owing to the internal current confinement structure, the DC-PBH laser diode does not require any stripe electrodes and permits a p-type metal contact to be formed on the whole top surface of the contact layer, and thus simplifies the fabrication process and offers high yield. However, the p-n-p-n current confinement structure has a relatively large capacitance, which will lead to a large displacement current flow through the p-n-p-n junction at high frequency operation. Furthermore, a current leakage path exists between the p-InP cladding layer 14 and p-InP current blocking layer 15 to the n-InP buffer layer 12. This leakage current will also cause optical power saturation when the laser is operated at high temperature or at high power output U.S. Pat. No. 4,597,085 discloses a technique, whereby an undoped-InP layer 26a, as shown in FIG. 2, is inserted into the current confinement structure to reduce the capacitance between the p-n junction. In this disclosure the undoped-InP layer 26a either forms an n-type layer with an impurity concentration of around $5 \times 10^{16}$ cm$^{-3}$, or a p-type layer with the same impurity concentration due to compensatory dispersion of p-dopant from the p-InP blocking layer 25 during epitaxial growth. With this layer, it reduces the effect of the impurity concentration of n-InP blocking layer 26 on the junction capacitance, and hence lowers the overall capacitance of the p-n-p-n current confinement structure.

Although the undoped-InP layer 26a is able to lower the impurity concentration on one side of the p-n junction, the impurity concentration is still in the range of ~$10^{16}$ cm$^{-3}$. In addition, this disclosure does not address the issue of the leakage current from the active region to the p-n-p-n confinement layers. As can be seen in FIG. 2, the p-InP cladding layer 24 is connected directly to the p-InP blocking layer 25, which will cause a large leakage of current, resulting in reduction in efficiency and deterioration in high-power performance of semiconductor laser.

Therefore, from the above, the design of the layer structure, especially the p-n-p-n confinement structure, should be improved in order to achieve high frequency, high temperature and high output power operation.

SUMMARY OF THE INVENTION

According to one aspect of the present invention, a semiconductor laser having a double-channel planar-buried-heterostructure (DC-PBH) formed on a substrate comprises:
  a buffer layer of a first compound semiconductor material of a first conductivity type (n-type) formed on the substrate;
  an active layer formed on the buffer layer, the active layer capable of light generation by laser action;
  a first cladding layer of a second compound semiconductor material of a second conductivity type (p-type) formed on the active layer;
  a first channel and a second channel extending through separate regions of the first cladding layer, the active layer and into the buffer layer, the first and second channels thereby defining an active region disposed between them, each of the first channel and second channel having a structure comprising:
    a first current blocking layer of a third compound semiconductor material of the second conductivity type formed on the buffer layer;
    an intermediate layer of a fourth compound semiconductor material formed on the first current blocking layer; and,
    a second current blocking layer of a fifth compound semiconductor material of the first conductivity type formed on the intermediate layer;
  each of the first current blocking layer, intermediate layer and second current blocking layer extending over an upper surface of the first cladding layer except for the portion in the active region;
  a second cladding layer of a sixth compound semiconductor material of the second conductivity type formed on the second current blocking layer and covering the upper surface of the first cladding layer in the active region; and,
  a contact layer of a seventh compound semiconductor material of the second conductivity type formed on the second cladding layer,
  wherein the fourth compound semiconductor, which forms the intermediate layer, is doped with a dopant to reduce junction capacitance and to reduce current leakage through the channel structure.

Preferably, the second compound semiconductor, which forms the first cladding layer, is substantially intrinsic (undoped) to reduce current leakage from the active region.

Preferably, the first and second channels comprise a further current blocking layer of an eighth compound semiconductor interposed between the buffer layer and the first current blocking layer and extending over the same area as the first current blocking layer, said eighth compound semiconductor being doped with a dopant to reduce current leakage from the active region both across a channel and through a channel.

According to another aspect of the present invention, a semiconductor laser having a double-channel planar-buried-heterostructure (DC-PBH) formed on a substrate comprises:
  a buffer layer of a first compound semiconductor material of a first conductivity type (n-type) formed on the substrate;

an active layer formed on the buffer layer, the active layer capable of light generation by laser action;

a first cladding layer of a second compound semiconductor material of a second conductivity type (p-type) formed on the active layer;

a first channel and a second channel extending through separate regions of the first cladding layer, the active layer and into the buffer layer, the first and second channels thereby defining an active region disposed between them, each of the first channel and second channel having a structure comprising:

a first current blocking layer of a third compound semiconductor material of the second conductivity type formed above the buffer layer;

an intermediate layer of an undoped fourth compound semiconductor material formed on the first current blocking layer; and, a second current blocking layer of a fifth compound semiconductor material of the first conductivity type formed on the intermediate layer;

each of the first current blocking layer, intermediate layer and second current blocking layer extending over an upper surface of the first cladding layer except for the portion in the active region;

a second cladding layer of a sixth compound semiconductor material of the second conductivity type formed on the second current blocking layer and covering the upper surface of the first cladding layer in the active region; and, a contact layer of a seventh compound semiconductor material of the second conductivity type formed on the second cladding layer, wherein the first and second channels comprise a further current blocking layer of an eighth compound semiconductor interposed between the buffer layer and the first current blocking layer, and extending over the same area as the first current blocking layer, said eighth compound semiconductor being doped with a dopant to reduce current leakage from the active region both across a channel and through a channel.

Preferably, the second compound semiconductor, which forms the first cladding layer, is substantially intrinsic (undoped) to reduce current leakage from the active region.

Preferably, the fourth compound semiconductor, which forms the intermediate layer, is doped with a dopant to reduce junction capacitance and to reduce current leakage through the channel structure.

According to a further aspect of the present invention, a semiconductor laser having a double-channel planar-buried-heterostructure (DC-PBH) formed on a substrate comprises:

a buffer layer of a first compound semiconductor material of a first conductivity type (n-type) formed on the substrate;

an active layer formed on the buffer layer, the active layer capable of light generation by laser action;

a first cladding layer of a second compound semiconductor material formed on the active layer;

a first channel and a second channel extending through separate regions of the first cladding layer, the active layer and into the buffer layer, the first and second channels thereby defining an active region disposed between them, each of the first channel and second channel having a structure comprising:

a first current blocking layer of a third compound semiconductor material of a second conductivity type (p-type) formed above the buffer layer;

an intermediate layer of an undoped fourth compound semiconductor material formed on the first current blocking layer; and, a second current blocking layer of a fifth compound semiconductor material of the first conductivity type formed on the intermediate layer;

each of the first current blocking layer, intermediate layer and second current blocking layer extending over an upper surface of the first cladding layer except for the portion in the active region;

a second cladding layer of a sixth compound semiconductor material of the second conductivity type formed on the second current blocking layer and covering the upper surface of the first cladding layer in the active region; and, a contact layer of a seventh compound semiconductor material of the second conductivity type formed on the second cladding layer, wherein the second compound semiconductor, which forms the first cladding layer, is substantially intrinsic (undoped) to reduce current leakage from the active region.

Preferably, the first and second channels comprise a further current blocking layer of an eighth compound semiconductor interposed between the buffer layer and the first current blocking layer and extending over the same area as the first current blocking layer, said eighth compound semiconductor being doped with a dopant to reduce current leakage from the active region both across a channel and through a channel.

Preferably, the fourth compound semiconductor, which forms the intermediate layer, is doped with a dopant to reduce junction capacitance and to reduce current leakage through the channel structure.

Preferably, the dopant is Iron (Fe) or Ruthenium (Ru).

Preferably, the active layer comprises undoped indium gallium arsenide phosphide (undoped-InGaAsP).

Preferably, the active layer comprises a quantum-well structure. Preferably, the quantum well structure is sandwiched between graded index confinement layers.

Preferably, the substrate comprises a layer of n-type indium phosphide (n-InP) and each of the first, third, fourth, fifth and sixth compound semiconductor materials are indium phosphide (InP) and the seventh compound semiconductor material is indium gallium arsenide phosphide (InGaAsP).

Preferably, the second compound semiconductor is indium phosphide (InP).

Alternatively, the second compound semiconductor is indium gallium arsenide phosphide (InGaAsP).

Preferably, the eighth compound semiconductor is indium phosphide (InP).

BRIEF DESCRIPTION OF THE DRAWINGS

Examples of the present invention will now be described in detail with reference to the accompanying drawings, in which.

DETAILED DESCRIPTION

Figure 1:
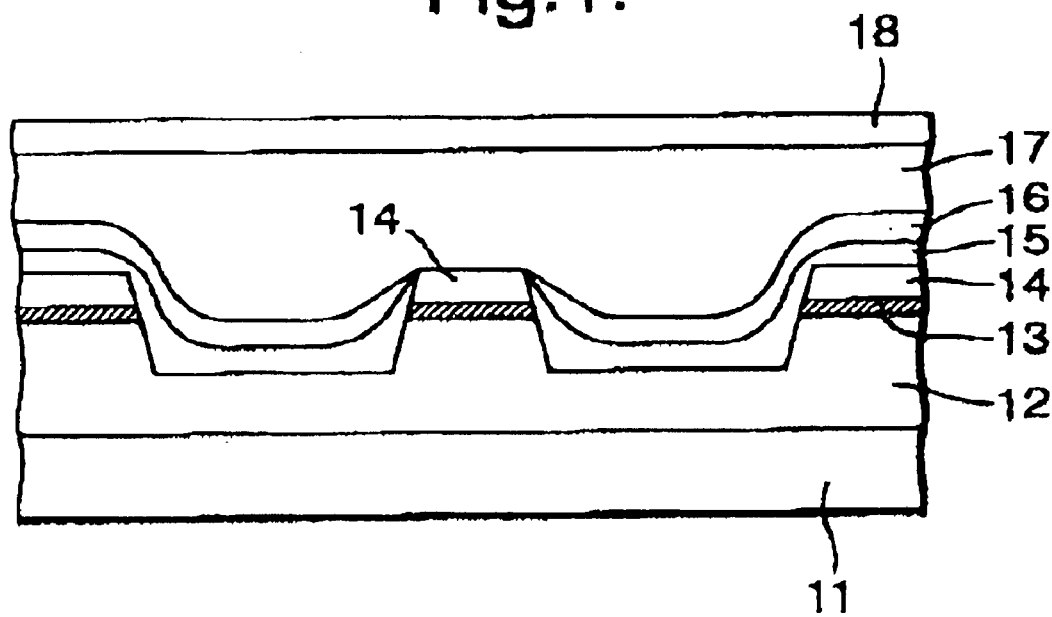
FIG. 1 shows the layer structure of an example of a conventional DC-PBH semiconductor laser.
Figure 2:
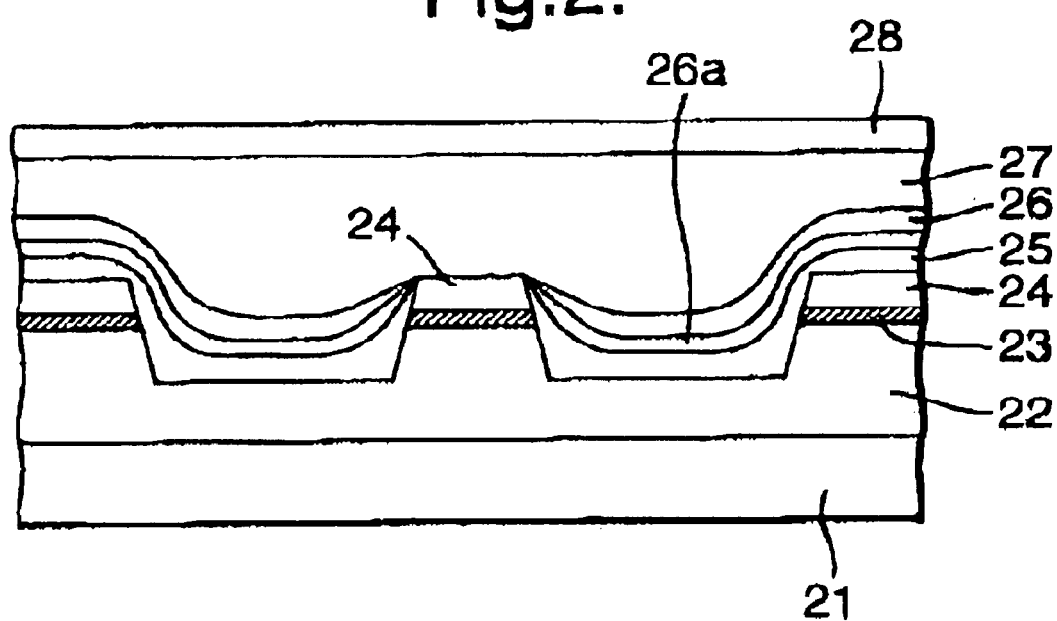
FIG. 2 shows another example of a conventional DC-PBH semiconductor laser having an un-doped InP layer within a p-n-p-n confinement structure.
Figure 3:
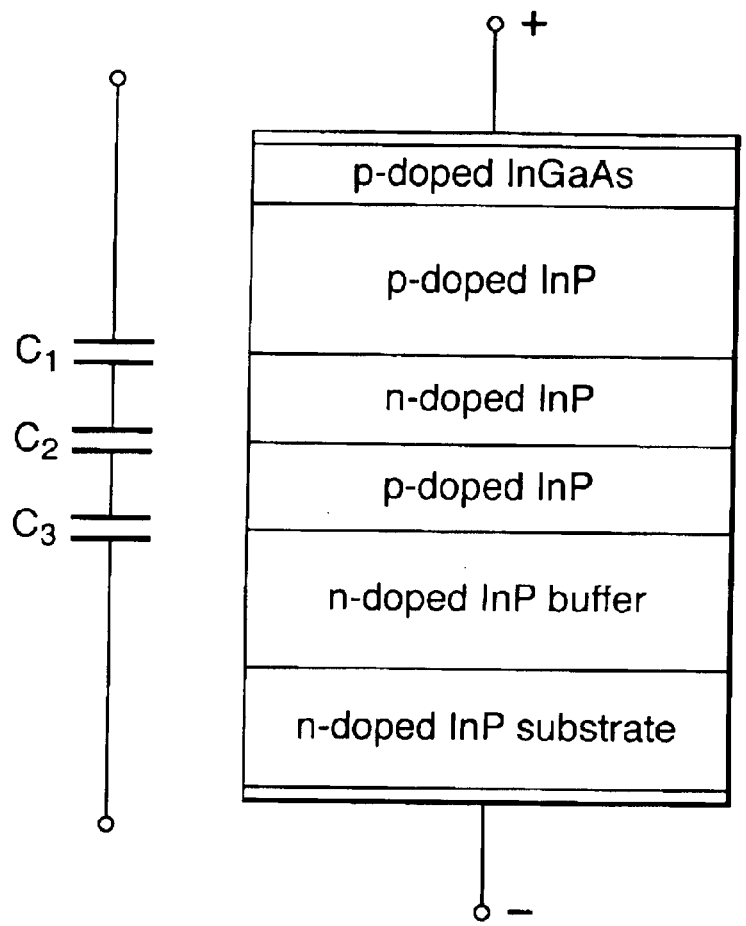
FIG. 3 is a schematic diagram showing the capacitances across the p-n-p-n junctions.

One of the major concerns with the DC-PBH laser diode in high frequency operation is its capacitance across the p-n-p-n junction. FIG. 3 shows the equivalent capacitances ($C_1$, $C_2$, and $C_3$) of the p-n-p-n junction. Each capacitance of the p-n junction $C_i$ (i=1, 2 and 3) is expressed by the following equation:

$$C_i = (q\epsilon_s/2)^{1/2} \times N_A N_D/(N_A+N_D) \times 1/(V_{bi} \pm V)$$

where q is the electron charge, $\epsilon_s$ is the dielectric constant, $V_{bi}$ is the built-in potential, V is the applied voltage, $N_A$ is the acceptor concentration, and $N_D$ is the donor concentration. The "±" sign in the above equation denotes the use of "+" for forward bias and "−" for reverse bias. The junction capacitance $C_{p-n-p-n}$ is obtained as a series connection of the capacitances $C_1$, $C_2$, and $C_3$. When a forward bias is applied across the laser diode, only the middle p-n junction is subjected to a reverse bias. Therefore, capacitance $C_2$ is the smallest and is essentially the main quantity that determines the junction capacitance $C_{p-n-p-n}$. If the applied voltage V is a fixed value, the junction capacitance $C_{p-n-p-n}$ will depend on the impurity concentration $N_A$ and $N_D$. Hence, it is very desirable to lower the capacitance $C_2$ so as to bring down the overall junction capacitance $C_{p-n-p-n}$.

Figure 4:
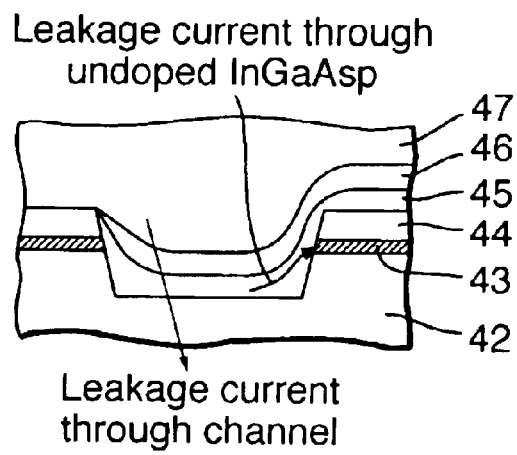
FIG. 4 is a schematic diagram of a p-n-p-n confinement structure illustrating leakage current paths.

Besides that, the leakage current flowing through the p-n-p-n current blocking layer in the DC-PBH laser diode should also be minimized for better device performance, particularly in high output power operation. As pointed out by U.S. Pat. No. 6,229,836 for the DC-PBH laser diode, there are two paths that the leakage current may flow. The first path is the flow through the channel via n-InP blocking layer 46 and p-InP blocking layer 45 as shown in FIG. 4. The other path is the flow through the p-InP blocking layer 45 to the undoped-InGaAsP layer 43.

Figure 5:
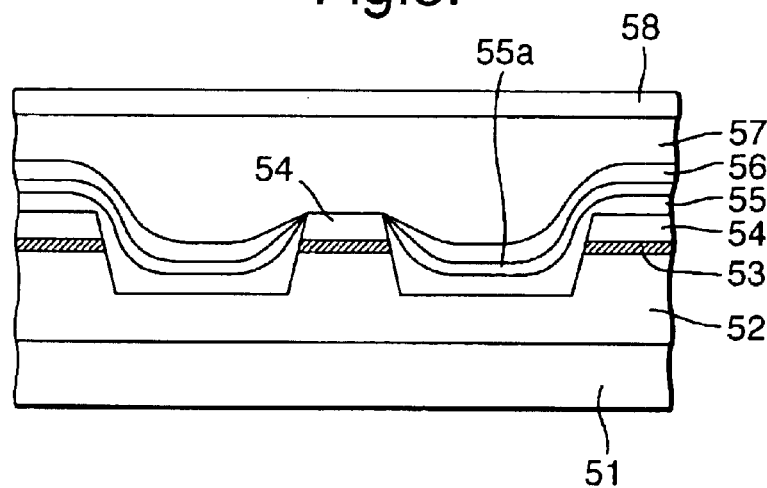
FIG. 5 is an example of a DC-PBH semiconductor laser structure in accordance with a first aspect of the present invention.

FIG. 5 illustrates a device structure in accordance with one aspect of the present invention. The structure is essentially the same as that described above, except for an additional layer of Fe-doped InP layer 55a inserted between n-InP blocking layer 56 and p-InP blocking layer 55. This Fe-doped InP layer 55a will create an acceptor level ($Fe^{3+}$/$Fe^{2+}$) near mid-band gap. The iron impurities are deep level traps, and will make the capacitance $C_2$ less dependent of the impurity concentration of layer 56, which is normally doped with a concentration larger than $1 \times 10^{18}$ cm$^{-3}$ to lower the leakage current from p-InP blocking layer 57 to p-InP blocking layer 55 that does not contribute to light emission. The capacitance $C_2$ and hence the overall capacitance $C_{p-n-p-n}$ will be reduced with this Fe-doped InP layer 55a, and consequently the displacement current through the current blocking structure during high speed operation will be lowered. In addition, as this Fe-doped InP layer is also a thermally stable semi-insulating material, a high resistivity layer is thus formed between the n-InP blocking layer 56 and p-InP blocking layer 55. Thus, this Fe-doped InP layer will also effectively reduce the leakage current flowing through the p-n-p-n current blocking channel as mentioned above.

When the active layer 53 is based on a quantum well structure, graded-index confinement layers (not shown) are provided above and below the active layer 53, for example, layers of InGaAsP. The confinement layers should be substantially intrinsic. However, each could be a single material with a single composition, and hence a uniform refractive index profile, or a multilayer material having a varying composition, and hence a graded refractive index profile for improved optical confinement.

Figure 6:
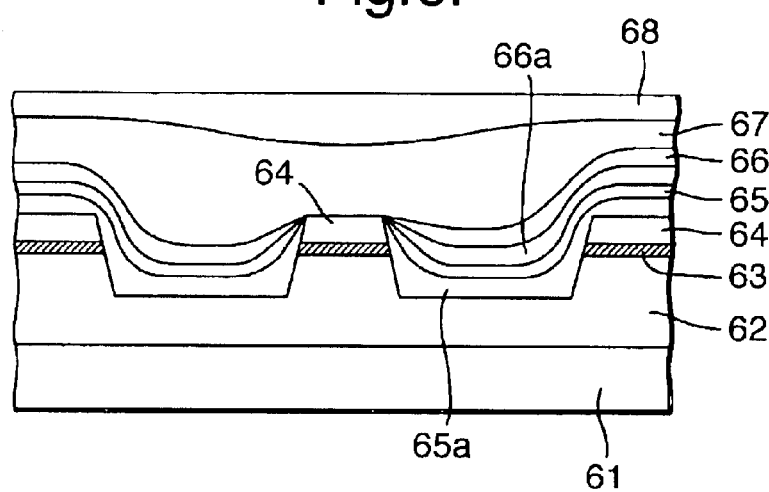
FIG. 6 is an example of a DC-PBH semiconductor laser structure in accordance with a second aspect of the present invention; and, FIG. 7 is an example of a DC-PBH semicondictor laser structure in accordance with a third aspect of the present invention.

In another aspect of the present invention we seek to reduce the high leakage current from the active region to the p-n-p-n confinement layers. Here, as shown in FIG. 6, a Fe-doped InP layer 65a is inserted in between the p-InP blocking layer 65 and the n-InP buffer layer 62. As mentioned before, this Fe-doped InP layer will act as a free carrier-trapping source and presents itself as a high resistivity layer. Therefore, it will decrease the leakage current from the active layer through the p-n-p-n confinement structure to the n-type buffer (both through p-InP blocking layer 65 to n-InP buffer layer 62, as well as to undoped active InGaAsP layer 63). Moreover, for the case of high output power operation, the leakage current through the p-n-p-n confinement structure near to the mesa waveguide might be large due to the increased optical generation of minority carriers from the emitted light spreading out of the waveguide. With this high resistivity Fe-doped layer incorporated in the p-n-p-n structure, the increase of the leakage current through the p-n-p-n layer from the above route will be greatly minimized, as compared to the conventional p-n-p-n layer.

Figure 7:
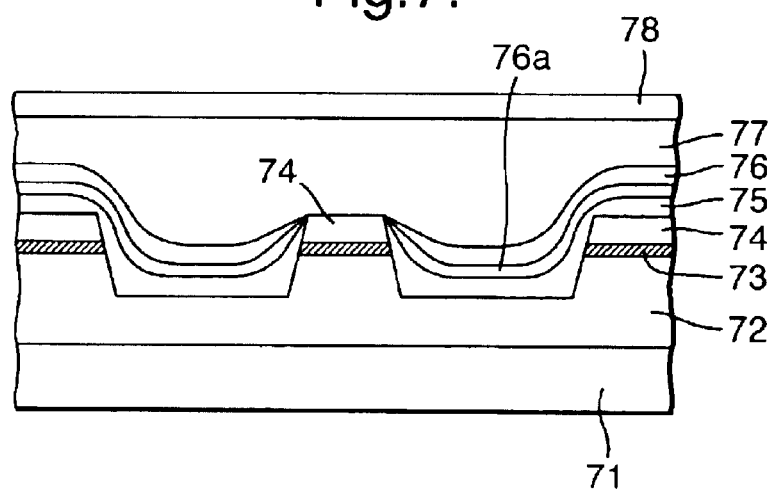

A further aspect of the present invention addresses the leakage current problem from the active region. Here, as shown in FIG. 7, the top p-InP cladding layer 74 is replaced by an intrinsic layer, such as an undoped graded index (GRIN) InGaAsP layer. The leakage current path from the p-doped InP layer 77 through this undoped layer 74 to p-InP blocking layer 75 will be reduced significantly, as compared to a p-doped InP layer in the prior art.

It should be emphasised that the above described three inventions work singly and independently to improve the performance of a prior-art DC-PBH laser diode. In addition, enhanced performance can be obtained by incorporating a combination of either at least two of the inventions or an integration of all the three inventions.

What is claimed is:

1. A semiconductor laser having a double-channel planar-buried-heterostructure (DC-PBH) formed on a substrate comprising:

a buffer layer of a first compound semiconductor material of a first conductivity type (n-type) formed on the substrate;

an active layer formed on the buffer layer, the active layer capable of light generation by laser action;

a first cladding layer of a second compound semiconductor material of a second conductivity type (p-type) formed on the active layer;

a first channel and a second channel extending through separate regions of the first cladding layer, the active layer and into the buffer layer, the first and second channels thereby defining an active region disposed between them, each of the first channel and second channel having a structure comprising:

a first current blocking layer of a third compound semiconductor material of the second conductivity type formed on the buffer layer;

an intermediate layer of a fourth compound semiconductor material formed on the first current blocking layer; and, a second current blocking layer of a fifth compound semiconductor material of the first conductivity type formed on the intermediate layer;

each of the first current blocking layer, intermediate layer and second current blocking layer extending over an upper surface of the first cladding layer except for the portion in the active region;

a second cladding layer of a sixth compound semiconductor material of the second conductivity type formed on the second current blocking layer and covering the upper surface of the first cladding layer in the active region; and, a contact layer of a seventh compound semiconductor material of the second conductivity type formed on the second cladding layer, wherein the fourth compound semiconductor material, which forms the intermediate layer, is doped with a dopant to reduce junction capacitance and to reduce current leakage through the channel structure.

2. A semiconductor laser according to claim 1, wherein the second compound semiconductor material, which forms the first cladding layer, is substantially intrinsic (undoped) to reduce current leakage from the active region.

3. A semiconductor laser according to claim 1, in which the first and second channels comprise a further current blocking layer of an eighth compound semiconductor material interposed between the buffer layer and the first current blocking layer and extending over the same area as the first current blocking layer, said eighth compound semiconductor material being doped with a dopant to reduce current leakage from the active region both across a channel and through a channel.

4. A semiconductor laser having a double-channel planar-buried-heterostructure (DC-PBH) formed on a substrate comprising:

a buffer layer of a first compound semiconductor material of a first conductivity type (n-type) formed on the substrate;

an active layer formed on the buffer layer, the active layer capable of light generation by laser action;

a first cladding layer of a second compound semiconductor material of a second conductivity type (p-type) formed on the active layer;

a first channel and a second channel extending through separate regions of the first cladding layer, the active layer and into the buffer layer, the first and second channels thereby defining an active region disposed between them, each of the first channel and second channel having a structure comprising:

a first current blocking layer of a third compound semiconductor material of the second conductivity type formed above the buffer layer;

an intermediate layer of an undoped fourth compound semiconductor material formed on the first current blocking layer; and, a second current blocking layer of a fifth compound semiconductor material of the first conductivity type formed on the intermediate layer;

each of the first current blocking layer, intermediate layer and second current blocking layer extending over an upper surface of the first cladding layer except for the portion in the active region;

a second cladding layer of a sixth compound semiconductor material of the second conductivity type formed on the second current blocking layer and covering the upper surface of the first cladding layer in the active region; and, a contact layer of a seventh compound semiconductor material of the second conductivity type formed on the second cladding layer, wherein the first and second channels comprise a further current blocking layer of an eighth compound semiconductor interposed between the buffer layer and the first current blocking layer, and extending over the same area as the first current blocking layer, said eighth compound semiconductor being doped with a dopant to reduce current leakage from the active region both across a channel and through a channel.

5. A semiconductor laser according to claim 4, wherein the second compound semiconductor material, which forms the first cladding layer, is substantially intrinsic (undoped) to reduce current leakage from the active region.

6. A semiconductor laser according to claim 4, in which the fourth compound semiconductor, which forms the intermediate layer, is doped with a dopant to reduce junction capacitance and to reduce current leakage through the channel structure.

7. A semiconductor laser having a double-channel planar-buried-heterostructure (DC-PBH) formed on a substrate comprising:

a buffer layer of a first compound semiconductor material of a first conductivity type (n-type) formed on the substrate;

an active layer formed on the buffer layer, the active layer capable of light generation by laser action;

a first cladding layer of a second compound semiconductor material formed on the active layer;

a first channel and a second channel extending through separate regions of the first cladding layer, the active layer and into the buffer layer, the first and second channels thereby defining an active region disposed between them, each of the first channel and second channel having a structure comprising:

a first current blocking layer of a third compound semiconductor material of a second conductivity type (p-type) formed above the buffer layer;

an intermediate layer of an undoped fourth compound semiconductor material formed on the first current blocking layer; and, a second current blocking layer of a fifth compound semiconductor material of the first conductivity type formed on the intermediate layer;

each of the first current blocking layer, intermediate layer and second current blocking layer extending over an upper surface of the first cladding layer except for the portion in the active region;

a second cladding layer of a sixth compound semiconductor material of the second conductivity type formed on the second current blocking layer and covering the upper surface of the first cladding layer in the active region; and, a contact layer of a seventh compound semiconductor material of the second conductivity type formed on the second cladding layer, wherein the second compound semiconductor material, which forms the first cladding layer, is substantially intrinsic (undoped) to reduce current leakage from the active region.

8. A semiconductor laser according to claim 7, in which the first and second channels comprise a further current blocking layer of an eighth compound semiconductor material interposed between the buffer layer and the first current blocking layer and extending over the same area as the first current blocking layer, said eighth compound semiconductor material being doped with a dopant to reduce current leakage from the active region both across a channel and through a channel.

9. A semiconductor laser according to claim 7, in which the fourth compound semiconductor material, which forms the intermediate layer, is doped with a dopant to reduce junction capacitance and to reduce current leakage through the channel structure.

10. A semiconductor laser according to any of claim 1, in which the dopant is one selected from a group consisting of Iron (Fe) and Ruthenium (Ru).

11. A semiconductor laser according to any preceding claim 1, in which the active layer comprises undoped indium gallium arsenide phosphide (undoped-InGaAsP).

12. A semiconductor laser according to claim 1, in which the active layer comprises a quantum-well structure.

13. A semiconductor laser according to claim 12, in which the quantum well structure is sandwiched between graded index confinement layers.

14. A semiconductor laser according to claim 1, in which the substrate comprises a layer of n-type indium phosphide (n-InP) and each of the first, third, fourth, fifth and sixth compound semiconductor materials are indium phosphide (InP) and the seventh compound semiconductor material is indium gallium arsenide phosphide (InGaAsP).

15. A semiconductor laser according to claim 1, in which the second compound semiconductor material is indium phosphide (InP).

16. A semiconductor laser according to claim 1, in which the second compound semiconductor material is indium gallium arsenide phosphide (InGaAsP).

17. A semiconductor laser according to any of claim 3, in which the eighth compound semiconductor material is indium phosphide (InP).

18. A semiconductor laser according to claim 4, in which the dopant is one selected from a group consisting of Iron (Fe) and Ruthenium (Ru).

19. A semiconductor laser according to claim 4, in which the active layer comprises undoped indium gallium arsenide phosphide (undoped-InGaAsP).

20. A semiconductor laser according to claim 4, in which the active layer comprises a quantum-well structure.

21. A semiconductor laser according to claim 20, in which the quantum well structure is sandwiched between graded index confinement layers.

22. A semiconductor laser according to claim 4, in which the substrate comprises a layer of n-type indium phosphide (n-InP) and each of the first, third, fourth, fifth and sixth compound semiconductor materials are indium phosphide (InP) and the seventh compound semiconductor material is indium gallium arsenide phosphide (InGaAsP).

23. A semiconductor laser according to claim 4, in which the second compound semiconductor material is at least one of indium phosphide (InP) and indium gallium arsenide phosphide (InGaAsP).

24. A semiconductor laser according to claim 4, in which the eighth compound semiconductor material is indium phosphide (InP).

25. A semiconductor laser according to claim 7, in which the dopant is one selected from a group consisting of Iron (Fe) and Ruthenium (Ru).

26. A semiconductor laser according to claim 7, in which the active layer comprises undoped indium gallium arsenide phosphide (undoped-InGaAsP).

27. A semiconductor laser according to claim 7, in which the active layer comprises a quantum-well structure.

28. A semiconductor laser according to claim 27, in which the quantum well structure is sandwiched between graded index confinement layers.

29. A semiconductor laser according to claim 7, in which the substrate comprises a layer of n-type indium phosphide (n-InP) and each of the first, third, fourth, fifth and sixth compound semiconductor materials are indium phosphide (InP) and the seventh compound semiconductor material is indium gallium arsenide phosphide (InGaAsP).

30. A semiconductor laser according to claim 7, in which the second compound semiconductor material is at least one of indium phosphide (InP) and indium gallium arsenide phosphide (InGaAsP).

31. A semiconductor laser according to claim 8, in which the eighth compound semiconductor material is indium phosphide (InP).

* * * * *